United States Patent
Zimmerman et al.

(10) Patent No.: US 9,267,668 B2
(45) Date of Patent: Feb. 23, 2016

(54) FIXTURES FOR LARGE AREA DIRECTIONAL AND ISOTROPIC SOLID STATE LIGHTING PANELS

(71) Applicants: Scott M. Zimmerman, Basking Ridge, NJ (US); Karl W. Beeson, Princeton, NJ (US); William R. Livesay, San Diego, CA (US); Richard L. Ross, Del Mar, CA (US)

(72) Inventors: Scott M. Zimmerman, Basking Ridge, NJ (US); Karl W. Beeson, Princeton, NJ (US); William R. Livesay, San Diego, CA (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

(21) Appl. No.: 14/020,892

(22) Filed: Sep. 8, 2013

(65) Prior Publication Data
US 2014/0153227 A1 Jun. 5, 2014

Related U.S. Application Data

(63) Continuation of application No. 12/380,439, filed on Feb. 27, 2009, now Pat. No. 8,558,438.

(60) Provisional application No. 61/067,934, filed on Mar. 1, 2008.

(51) Int. Cl.
| | |
|---|---|
| F21V 13/08 | (2006.01) |
| F21K 99/00 | (2010.01) |
| H01L 33/50 | (2010.01) |
| F21S 9/03 | (2006.01) |
| F21V 9/08 | (2006.01) |
| F21V 21/096 | (2006.01) |
| F21S 9/02 | (2006.01) |
| F21V 29/505 | (2015.01) |
| F21V 29/83 | (2015.01) |
| F21V 13/00 | (2006.01) |
| H01L 33/60 | (2010.01) |
| H01L 33/64 | (2010.01) |
| F21V 29/00 | (2015.01) |
| F21V 29/54 | (2015.01) |

(52) U.S. Cl.
CPC . *F21V 13/08* (2013.01); *F21K 9/00* (2013.01); *F21K 9/56* (2013.01); *F21S 9/02* (2013.01); *F21S 9/03* (2013.01); *F21V 9/08* (2013.01); *F21V 21/096* (2013.01); *F21V 29/505* (2015.01); *F21V 29/83* (2015.01); *H01L 33/507* (2013.01); *F21V 29/006* (2013.01); *F21V 29/20* (2013.01); *F21V 29/54* (2015.01); *H01L 33/60* (2013.01); *H01L 33/642* (2013.01); *H01L 33/648* (2013.01); *H01L 2924/0002* (2013.01); *Y02B 10/10* (2013.01)

(58) Field of Classification Search
CPC ............. F21S 9/03; F21V 9/08; F21V 13/08; F21V 21/096; F21V 29/505; H01L 33/507
See application file for complete search history.

(56) References Cited

U.S. PATENT DOCUMENTS

| | | | |
|---|---|---|---|
| 4,752,756 A | 6/1988 | Bartel | |
| 5,397,238 A * | 3/1995 | Och | F21V 21/08 174/117 A |

(Continued)

FOREIGN PATENT DOCUMENTS

WO   WO 2007003035   1/2007

*Primary Examiner* — Anh Mai
*Assistant Examiner* — Nathaniel Lee
(74) *Attorney, Agent, or Firm* — William Propp, Esq.

(57) ABSTRACT

Reflector designs for a large area panel light source create induced draft cooling means adjacent to the panel light source. The panel light source has a wavelength conversion element on a solid state light source for emitting light of a first and second wavelength to form a broader emission spectrum of light from the panel light source.

3 Claims, 7 Drawing Sheets

(56) References Cited

U.S. PATENT DOCUMENTS

| | | |
|---|---|---|
| 7,285,791 B2 | 10/2007 | Beeson et al. |
| 2005/0174762 A1* | 8/2005 | Fogerlie .................. F21S 8/086 362/183 |
| 2006/0001384 A1* | 1/2006 | Tain ........................ F21K 9/00 315/246 |
| 2006/0232193 A1* | 10/2006 | Fiedler ............... C09K 11/0883 313/503 |
| 2008/0042153 A1 | 2/2008 | Beeson et al. |
| 2008/0149166 A1 | 6/2008 | Beeson et al. |
| 2008/0182353 A1 | 7/2008 | Zimmerman et al. |
| 2008/0258165 A1 | 10/2008 | Zimmerman et al. |

\* cited by examiner

FIXTURES FOR LARGE AREA DIRECTIONAL AND ISOTROPIC SOLID STATE LIGHTING PANELS

REFERENCE TO PRIOR APPLICATION

This application is a continuation of U.S. application Ser. No. 12/380,439 filed Feb. 27, 2009, which claims the benefit of U.S. Provisional Patent Application Serial No. U.S. Ser. No. 61/067,934, which was filed on Mar. 1, 2008, all commonly assigned as the present application and herein incorporated by reference.

BACKGROUND OF THE INVENTION

Panel light fixtures are typically designed to take into account the light distribution, intensity, and thermal characteristics of the source. Panel light fixtures have historically been incandescent light bulbs or fluorescent light bulbs. A wide range of reflectors and optical devices have been developed over the years to generate a particular output distribution and/or deliver maximum efficiency for an incandescent light bulb.

Fluorescent light bulbs work differently than incandescent light bulbs. An incandescent light has electricity pass through a filament, which emits light. A fluorescent light is a gas discharge light where electricity excites mercury vapor, which emits ultraviolet light. The ultraviolet light strikes phosphors in the fluorescent light, which in turn emit visible light. Fluorescent light bulbs have the added need of ballasts or other electronic methods of converting the available power into a useful form. Fluorescent light bulbs use different reflectors and different optical devices from an incandescent light bulb to achieve a similar result of a particular output distribution and/or maximum efficiency for a fluorescent bulb.

A new light source based on a distributed array of light emitting diodes (LEDs) within a solid luminescent element has been disclosed by Zimmerman et al. in U.S. Pat. No. 7,285,791, commonly assigned as the present application and herein incorporated by reference. Electricity passes through an active region of semiconductor material to emit light in a light emitting diode. The solid luminescent element is a wavelength conversion chip. US Published Patent Applications 20080042153 and 20080149166, commonly assigned as the present application and herein incorporated by reference, teach wavelength conversion chips for use with light emitting diodes. A light emitting diode, such as those in US Published Patent Applications 20080182353 and 20080258165, commonly assigned as the present application and herein incorporated by reference, will emit light of a first wavelength and that first wavelength light will be converted into light of a second wavelength by the wavelength conversion chip.

A panel light source can be made in a variety of shapes and output distributions ranging from directional to isotropic using thermally conductive luminescent elements. Power conditioning and control electronics can also be incorporated into the bulb itself because the thermally conductive luminescent element is a solid. A variety of means can also be used to connect to the available power source. In addition, the distributed nature of the sources allows for cooling via natural convection means as long as sufficient airflow is allowed by the light fixture eliminating or greatly reducing the need for additional heatsinking means. It also provides a substrate for integration of solar and energy storage means.

In most cases, existing LED light sources are based on high intensity point sources, which required extensive thermal heatsinking to operate and distribute the heat generated in the point sources over a large area. The localized nature of these high intensity point sources dictate that large heatsinks must be used especially in the case of natural convection cooled applications. While 100 lumen/watt performance levels have been demonstrated for bulbs outside the fixture, performance can degrade as much as 50% once this type of solid state light source is used inside the fixture due to airflow restriction and lack of ventilation. This is especially true for the cases where fixtures are surrounded by insulation, as is the case for most residential applications. The heatsinks typically required to cool these high intensity point sources are both heavy and present a hazard especially in overhead lighting applications, where a falling light could severely injure a passerby. Additionally, the fact that the source is so localized means that some type of distribution or diffusing means must be used to deal with the brightness level generated. This is required from an aesthetic and safety point of view. The small nature of the source means that imaging of the source on the retina of the eye is of great concern. This is especially true for UV and blue sources due to additive photochemical effects. In general, brightness levels greater than 5,000 to 10,000 FtL are uncomfortable for direct viewing especially at night. High intensity point sources can be several orders of magnitude higher brightness than what can be comfortably viewed directly. Lastly, the localized nature of the heat source generated by these high intensity point sources dictate that high efficiency heat sink designs must be used which are more susceptible to dust and other environmental effects especially in outside applications. This dictates periodic maintenance of the light sources, which is impractical in many cases. The need therefore exists for improved fixtures that can provide directional control, allow cooling of the sources, and safely illuminate our homes and businesses. Panel lights based on thermally conductivity luminescent elements are disclosed which enable new types of light fixtures and are ideally suited for general illumination applications.

SUMMARY OF THE INVENTION

According to the present invention, a solid state light source, such as a light emitting diode, an organic light emitting diode, an inorganic light emitting diode, an edge emitter light emitting diode, a vertical cavity surface emitting laser, or a laser diode, and a thermally conductive luminescent element, such as a wavelength conversion element or a phosphor element, with a reflector means will form a panel light fixture. The solid state light source is typically a point light source of a single wavelength but the panel light fixture transmits light of a broader emission spectrum over a large area.

This disclosure covers a variety of reflector designs for panel light sources and configuration of panel lights containing thermally conductive luminescent elements. The panel light sources disclosed in this invention consist of at least one thermally conductive luminescent element to which at least one solid state light source is attached, and an interconnect means. The at least one thermally conductive luminescent element not only converts at least a portion of the light emitted from the at least one solid state light source into a broader emission spectrum, but it also serves to diffuse/distribute the light generated as well as provide a cooling path for itself and the at least one solid state light source to the surrounding ambient via convection off the surface of the at least one thermally conductive luminescent element. More preferably, the at least one thermally conductive luminescent element enables the formation of panel lights which can be directly viewed with human eye without the need for further diffusion or protective means.

The use of freestanding epitaxial chips as the solid state light sources is preferred for both directional and isotropic panel lights. The combination of the panel lights and solar conversion and/or energy storage means is a preferred embodiment of this invention. In this manner, compact light sources can be created which do not require external power sources.

The use of at least one of these panel light sources in a fixture is a preferred embodiment of this invention. Both directional (lambertian and narrower angular distribution) and isotropic sources are disclosed in a variety of fixtures. Fixture design can create induced draft cooling channels around or in proximity to the panel light Other aspects of the invention will become apparent from the following more detailed description, taken in conjunction with the accompanying drawings.

DETAILED DESCRIPTION OF DRAWINGS

Figure 1:
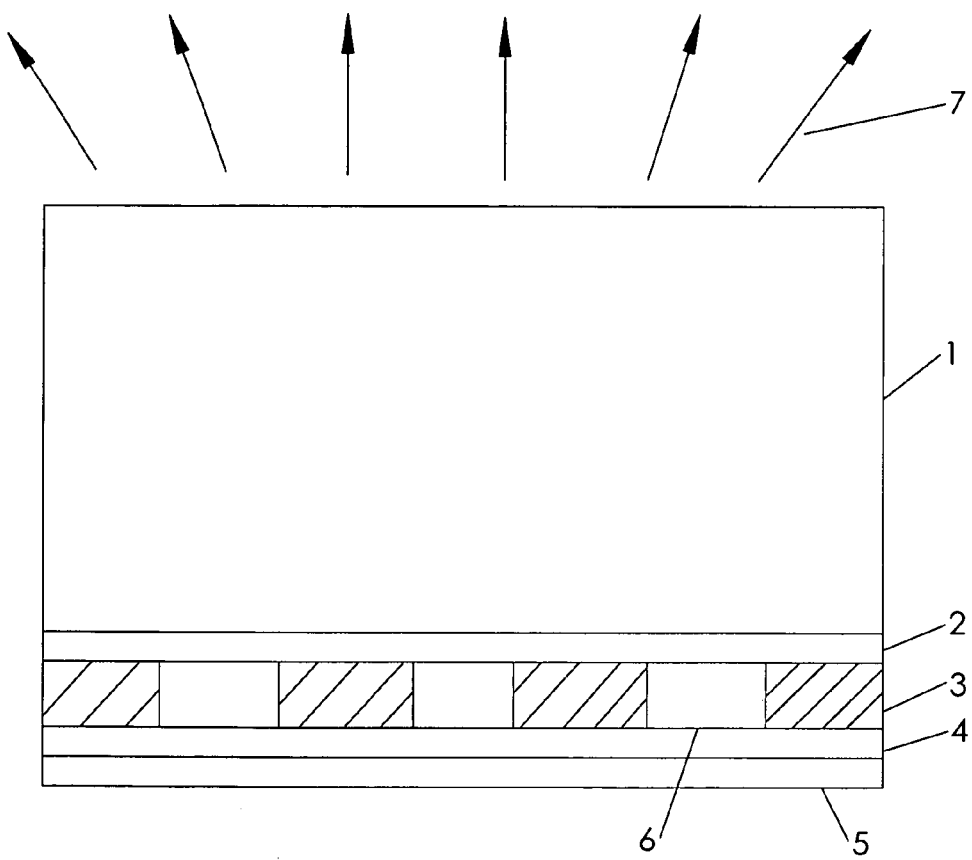
FIG. 1 is a side view of a lambertian directional panel light source of the present invention.

FIG. 1 depicts a lambertian directional panel light source, which consists of a solid wavelength conversion element 1 on a solid state light source 6. The light source 6 may be light emitting diode with an active region of a pn junction, single quantum well, multiple quantum wells, single heterojunction or double heterojunction; an organic light emitting diode, an inorganic light emitting diode, an edge emitter light emitting diode, a vertical cavity surface emitting laser, or a laser diode. Electrical interconnect means 2 and 4, including but not limited to, wires, transparent conductive oxides (evaporative and spin-on), thick film conductive pastes, patterned evaporative metals, and conductive epoxies, are positioned on either side of the solid state light source 6 to drive the solid state light source 6 to emit light. The wavelength conversion element 1 is on one surface of the solid state light source 6. A substantially reflective layer 5 covers the opposite surface of the solid state light source 6 from the wavelength conversion element 1. The light source 6 is shown as multiple elements and the total emitting area of these elements is much less than the cross-sectional area of the wavelength conversion element 1 to which the light source elements 6 are mounted.

The wavelength conversion element is formed from wavelength conversion materials. The wavelength conversion materials absorb light in a first wavelength range and emit light in a second wavelength range, where the light of a second wavelength range has longer wavelengths than the light of a first wavelength range. The wavelength conversion materials may be, for example, phosphor materials or quantum dot materials. The wavelength conversion element may be formed from two or more different wavelength conversion materials. The wavelength conversion element may also include optically inert host materials for the wavelength conversion materials of phosphors or quantum dots. Any optically inert host material must be transparent to ultraviolet and visible light.

Phosphor materials are typically optical inorganic materials doped with ions of lanthanide (rare earth) elements or, alternatively, ions such as chromium, titanium, vanadium, cobalt or neodymium. The lanthanide elements are lanthanum, cerium, praseodymium, neodymium, promethium, samarium, europium, gadolinium, terbium, dysprosium, holmium, erbium, thulium, ytterbium and lutetium. Optical inorganic materials include, but are not limited to, sapphire ($Al_2O_3$), gallium arsenide (GaAs), beryllium aluminum oxide ($BeAl_2O_4$), magnesium fluoride ($MgF_2$), indium phosphide (InP), gallium phosphide (GaP), yttrium aluminum garnet (YAG or $Y_3Al_5O_{12}$), terbium-containing garnet, yttrium-aluminum-lanthanide oxide compounds, yttrium-aluminum-lanthanide-gallium oxide compounds, yttrium oxide ($Y_2O_3$), calcium or strontium or barium halophosphates $(Ca,Sr,Ba)_5(PO_4)_3(Cl,F)$, the compound $CeMgAl_{11}O_{19}$, lanthanum phosphate ($LaPO_4$), lanthanide pentaborate materials ((lanthanide)($Mg,Zn$)$B_5O_{10}$), the compound $BaMgAl_{10}O_{17}$, the compound $SrGa_2S_4$, the compounds $(Sr,Mg,Ca,Ba)(Ga,Al,In)_2S_4$, the compound SrS, the compound ZnS and nitridosilicate. There are several exemplary phosphors that can be excited at 250 nm or thereabouts. An exemplary red emitting phosphor is $Y_2O_3:Eu^{3+}$. An exemplary yellow emitting phosphor is YAG:$Ce^{3+}$. Exemplary green emitting phosphors include $CeMgAl_{11}O_{19}:Tb^{3+}$, ((lanthanide)$PO_4:Ce^{3+},Tb^{3+}$) and $GdMgB_5O_{10}:Ce^{3+},Tb^{3+}$. Exemplary blue emitting phosphors are $BaMgAl_{10}O_{17}:Eu^{2+}$ and $(Sr,Ba,Ca)_5(PO_4)_3Cl:Eu^{2+}$. For longer wavelength LED excitation in the 400-450 nm wavelength region or thereabouts, exemplary optical inorganic materials include yttrium aluminum garnet (YAG or $Y_3Al_5O_{12}$), terbium-containing garnet, yttrium oxide ($Y_2O_3$), $YVO_4$, $SrGa_2S_4$, $(Sr,Mg,Ca,Ba)(Ga,Al,In)_2S_4$, SrS, and nitridosilicate. Exemplary phosphors for LED excitation in the 400-450 nm wavelength region include YAG:$Ce^{3+}$, YAG:$Ho^{3+}$, YAG:$Pr^{3+}$, YAG:$Tb^{3+}$, YAG:$Cr^{3+}$, YAG:$Cr^{4+}$, $SrGa_2S_4:Eu^{2+}$, $SrGa_2S_4:Ce^{3+}$, SrS:$Eu^{2+}$ and nitridosilicates doped with $Eu^{2+}$.

Luminescent materials based on ZnO and its alloys with Mg, Cd, Al are preferred. More preferred are doped luminescent materials of ZnO and its alloys with Mg, Cd, Al which contain rare earths, Bi, Li, Zn, as well as other luminescent dopants. Even more preferred is the use of luminescent elements which are also electrically conductive, such a rare earth doped AlZnO, InZnO, GaZnO, InGaZnO, and other transparent conductive oxides of indium, tin, zinc, cadmium, aluminum, and gallium. The use of these transparent conductive oxides, oxynitrides and nitrides which are also luminescent as both interconnect means and/or wavelength conversion means is also an embodiment of this invention. Other phosphor materials not listed here are also within the scope of this invention.

Quantum dot materials are small particles of inorganic semiconductors having particle sizes less than about 30 nanometers. Exemplary quantum dot materials include, but are not limited to, small particles of CdS, CdSe, ZnSe, InAs, GaAs and GaN. Quantum dot materials can absorb light at first wavelength and then emit light at a second wavelength, where the second wavelength is longer than the first wavelength. The wavelength of the emitted light depends on the particle size, the particle surface properties, and the inorganic semiconductor material.

The transparent and optically inert host materials are especially useful to spatially separate quantum dots. Host materials include polymer materials and inorganic materials. The polymer materials include, but are not limited to, acrylates, polystyrene, polycarbonate, fluoroacrylates, chlorofluoroacrylates, perfluoroacrylates, fluorophosphinate polymers, fluorinated polyimides, polytetrafluoroethylene, fluorosilicones, sol-gels, epoxies, thermoplastics, thermosetting plastics and silicones. Fluorinated polymers are especially useful at ultraviolet wavelengths less than 400 nanometers and infrared wavelengths greater than 700 nanometers owing to their low light absorption in those wavelength ranges. Exemplary inorganic materials include, but are not limited to, silicon dioxide, optical glasses and chalcogenide glasses.

The solid state light source is typically a light emitting diode. Light emitting diodes (LEDs) can be fabricated by epitaxially growing multiple layers of semiconductors on a growth substrate. Inorganic light-emitting diodes can be fabricated from GaN-based semiconductor materials containing gallium nitride (GaN), aluminum nitride (AlN), aluminum gallium nitride (AlGaN), indium nitride (InN), indium gallium nitride (InGaN) and aluminum indium gallium nitride (AlInGaN). Other appropriate materials for LEDs include, for example, aluminum gallium indium phosphide (AlGaInP), gallium arsenide (GaAs), indium gallium arsenide (InGaAs), indium gallium arsenide phosphide (InGaAsP), diamond or zinc oxide (ZnO).

Especially important LEDs for this invention are GaN-based LEDs that emit light in the ultraviolet, blue, cyan and green regions of the optical spectrum. The growth substrate for GaN-based LEDs is typically sapphire ($Al_2O_3$), silicon carbide (SiC), bulk gallium nitride or bulk aluminum nitride.

A solid state light source can be a blue or ultraviolet emitting LED used in conjunction with one or more wavelength conversion materials such as phosphors or quantum dots that convert at least some of the blue or ultraviolet light to other wavelengths. For example, combining a yellow phosphor with a blue emitting LED can result in a white light source. The yellow phosphor converts a portion of the blue light into yellow light. Another portion of the blue light bypasses the yellow phosphor. The combination of blue and yellow light appears white to the human eye. Alternatively, combining a green phosphor and a red phosphor with a blue LED can also form a white light source. The green phosphor converts a first portion of the blue light into green light. The red phosphor converts a second portion of the blue light into green light. A third portion of the blue light bypasses the green and red phosphors. The combination of blue, green and red light appears white to the human eye. A third way to produce a white light source is to combine blue, green and red phosphors with an ultraviolet LED. The blue, green and red phosphors convert portions of the ultraviolet light into, respectively, blue, green and red light. The combination of the blue, green and red light appears white to the human eye.

A power source (not shown) supplies current through the electrical interconnect means 2 and 4 to the solid state light source 6, which emits light of a first wavelength. Electrical interconnect means 2 and 4 are transmissive to light of the first wavelength emitted by the solid state light source 6. The first wavelength light will be emitted through the electrical interconnect means 2 and then through the wavelength conversion element 1; or through the electrical interconnect means 4, reflected from the reflective layer 5, through the solid state light source 6, through the electrical interconnect means 2 through and then through the wavelength conversion element 1. The wavelength conversion element 1 will convert some of the light of a first wavelength into light of a second wavelength. The second wavelength is different from the first wavelength. The light of the second wavelength will be transmitted out of the wavelength conversion element 1. The remainder of the unconverted light of the first wavelength will also be transmitted out of the wavelength conversion element 1 with the light of the second wavelength. The combination of light of the first wavelength with light of the second wavelength provides a broader emission spectrum of light from the combination of a solid state light source 6 and a solid wavelength conversion element 1. The combination light is lambertian and directional from the panel light source.

Electrical interconnect means 6 is positioned between the solid state light source 6 and the solid wavelength conversion element 1. Alternately, the solid wavelength conversion element 1 may be electrically conductive and able to deliver current to the solid state light source 6.

The solid state light source 6 may be a plurality of solid state light sources. This plurality of solid state light sources can be arranged co-planar or vertically for the panel light source. A single solid wavelength conversion element 1 or a plurality of solid wavelength conversion elements can be used with the plurality of solid state light sources.

A barrier layer 3 may be used between and parallel to the plurality of solid state light sources between the electrical interconnect means 2 and 4 to isolate interconnect means 2 and 4. This barrier layer 3 may be used to form environmental and electrically insulative protection for the solid state light sources 6. The barrier layer includes, but is not limited to, sol-gels, glasses, epoxies and frits.

Spectrum, angular, and polarization means such as dichroic films, microoptics, and reflective polarizers, either on or in proximity to the panel light source, may modify the output distribution of the panel light source of FIG. 1.

Figure 2:
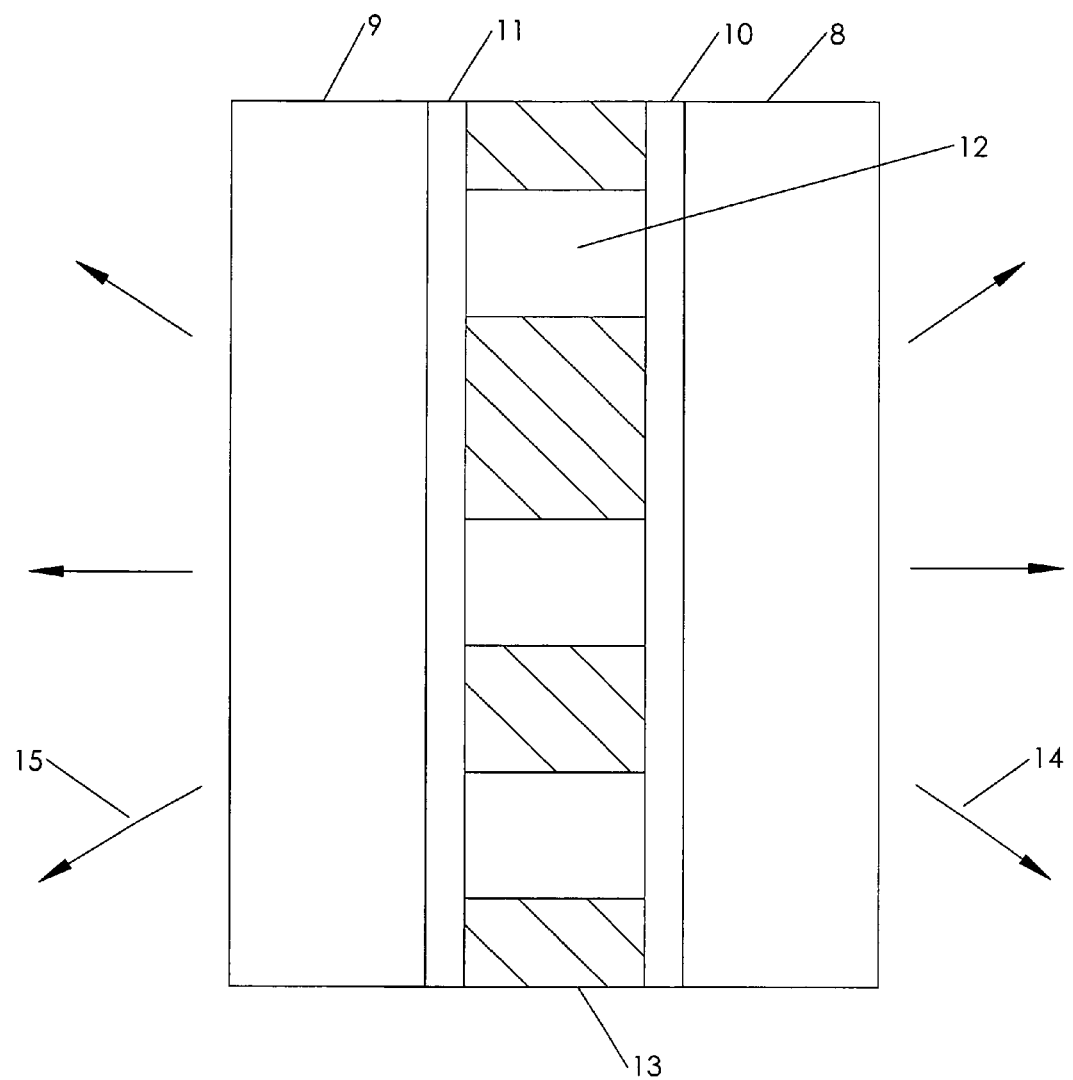
FIG. 2 is a side view of an isotropic panel light source of the present invention.

FIG. 2 depicts a substantially isotropic panel light source which consists of a solid state light source 12 between two solid wavelength conversion elements 8 and 9. The substantially isotropic panel light source has a first solid wavelength conversion element 8, a first electrical interconnect means 10, a solid state light source 12, a second electrical interconnect means 11, and a second solid wavelength conversion element 9. The first solid wavelength conversion element 8 and the second solid wavelength conversion element 10 are formed of the same wavelength conversion material and both convert light of a first wavelength onto light of the same second wavelength. As in the FIG. 1 structure, the light source 12 in FIG. 2 is shown as multiple elements and the total emitting area of these elements is much less than the cross-sectional area of either of the wavelength conversion elements 8 and 9 between which the light source elements 12 are mounted.

A power source (not shown) supplies current through the electrical interconnect means 10 and 11 to the solid state light source 12, which emits light of a first wavelength. Electrical interconnect means 10 and 11 are transmissive to light of the first wavelength emitted by the solid state light source 12.

The first wavelength light will be emitted from the solid state light source 12 through the electrical interconnect means 10 to the wavelength conversion element 9. The first wavelength light will also be emitted from the solid state light source 12 through the electrical interconnect means 10 to the wavelength conversion element 8. Light 15 and 14 is emitted from both sides of the planar light source of FIG. 2.

The first wavelength light will be emitted from the solid state light source 12 through the electrical interconnect means 11 to the wavelength conversion element 9. The wavelength conversion element 9 will convert some of the light of a first wavelength into light of a second wavelength. The second wavelength is different from the first wavelength. The light of the second wavelength will be transmitted out of the wavelength conversion element 9. The remainder of the unconverted light of the first wavelength will also be transmitted out of the wavelength conversion element 9 with the light of the second wavelength. The combination of light of the first wavelength with light of the second wavelength provides a broader emission spectrum of light 15 from the combination of a solid state light source 12 and a solid wavelength conversion element 9.

At the same time, the first wavelength light will be emitted from the solid state light source 12 through the electrical interconnect means 10 to the wavelength conversion element 8. The wavelength conversion element 8 will convert some of the light of a first wavelength into light of a second wavelength. The second wavelength is different from the first wavelength. The light of the second wavelength will be transmitted out of the wavelength conversion element 8. The remainder of the unconverted light of the first wavelength will also be transmitted out of the wavelength conversion element 9 with the light of the second wavelength. The combination of light of the first wavelength with light of the second wavelength provides a broader emission spectrum of light 14 from the combination of a solid state light source 12 and a solid wavelength conversion element 8.

Light is emitted from both sides of the planar light source of FIG. 2. The combination light from both sides of the planar light source is substantially isotropic from the panel light source. If the output from each side is lambertian, then the light source is an isotropic emitter. If a dichroic, microoptic, polarizer, or photonic crystal structure is added to the luminescent element, the light source will be a directional emitter from one or both sides.

The solid state light source 12 may be a plurality of solid state light sources. This plurality of solid state light sources can be arranged co-planar or vertically for the panel light source. A single solid wavelength conversion element 9 or 8 or a plurality of solid wavelength conversion elements can be used with the plurality of solid state light sources.

A barrier layer 13 may be used between and parallel to the plurality of solid state light sources between the electrical interconnect means 11 and 10 to isolate interconnect means 11 and 10. This barrier layer 13 may be used to form environmental and electrically insulative protection for the solid state light sources 12. The barrier layer includes, but is not limited to, sol-gels, glasses, epoxies and frits.

As in FIG. 1, intrinsically electrically conductive solid wavelength conversion elements 8 and/or 9 of FIG. 2 may be used alternately, or in combination with one or both of interconnect means 10 and/or 11, to deliver power to solid state lighting source 12. The use of freestanding epitaxial chips, which emit substantially isotropical light, are a preferred solid state light source.

Spectrum, angular, and polarization means such as dichroic films, microoptics; and reflective polarizers, either on or in proximity to the panel light source, may modify the output distribution of the panel light source of FIG. 2.

Figure 3:
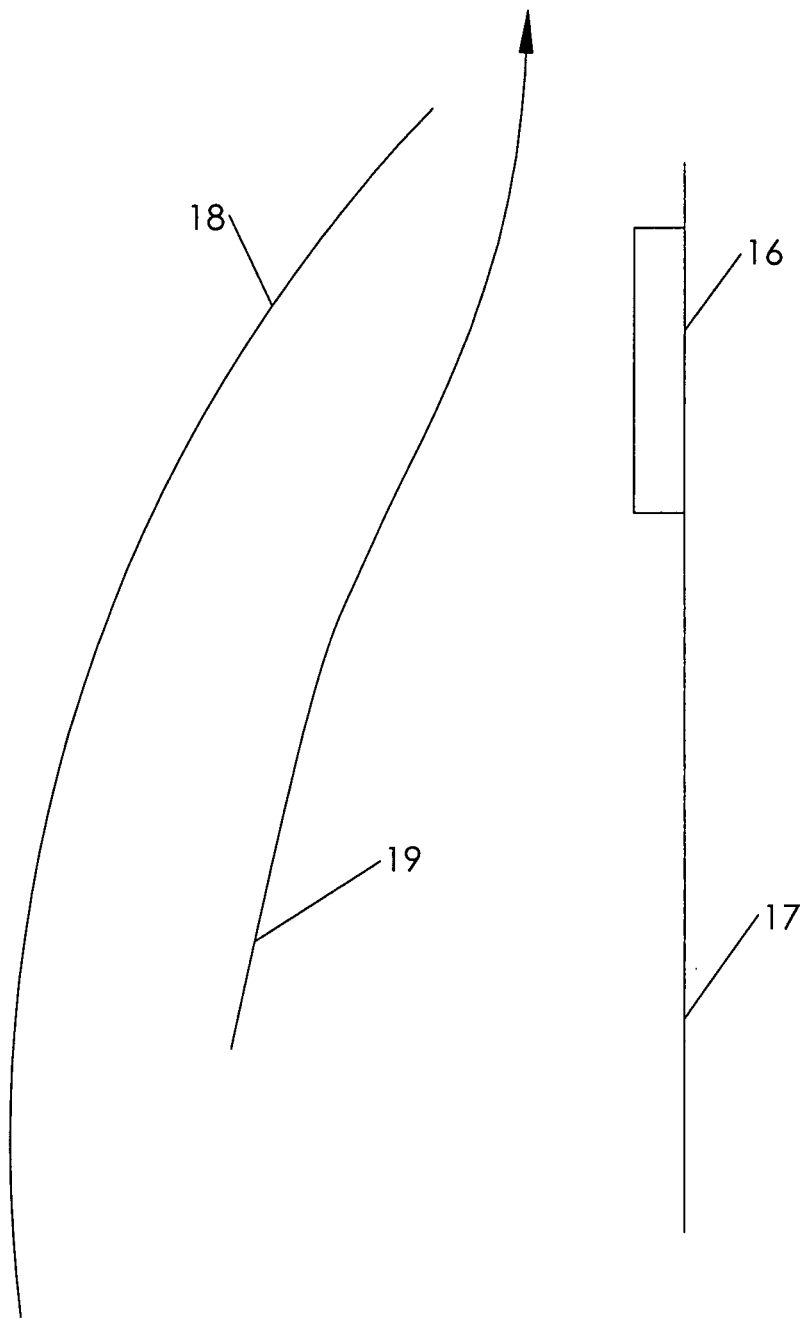
FIG. 3 is a side view of a wall washer based on a lambertian panel light with induced draft cooling flow of the present invention.

FIG. 3 depicts a lighting fixture that reflects and directs the light from a directional panel light source 16 substantially down a vertical surface 17 to form a wall washing effect. The directional panel light 16 is positioned on the vertical surface 17. A curved reflector 18 is spaced from the directional panel light 16 and the vertical surface 17, starting roughly parallel to the directional panel light 16 and curving outward and down from the directional panel light source. The curved reflector will reflect and direct light emitted from the directional panel light source down the vertical surface. The vertical surface 17 can be a mount or a wall. The curved reflector can be supported by the vertical surface.

Airflow 19 is between the vertical surface 17 and the curved reflector 16 past the directional light source 16 and exits through at least one opening in reflector 18. The airflow is via induced draft effects created by the heat generated by the directional light source 16 and the induced draft structure created by vertical surface 17 and curved reflector 16. The airflow cools the directional light source 16. Fixture design creates induced draft cooling channels around or in proximity to the panel light The thermally conductive luminescent element not only converts at least a portion of the light emitted from the solid state light source into a broader emission spectrum, but it also serves to diffuse/distribute the light generated as well as provide a cooling path for itself and the solid state light source to the surrounding ambient via convection off the surface of the thermally conductive luminescent element.

Baffling can be optionally used to prevent light leakage through the opening in the curved reflector 18. Also alternately, the directional panel light source 16 can emit a portion of light through the opening in the curved reflector 18 to provide up lighting.

Optionally, thermal conduction and additional cooling means, such as thermoelectric coolers, heatsinks and heat pipes, can be added to directional panel light source 16 to further cool the directional panel light 16.

Alternately, the curved reflector can extend upward to direct the light from the light source in an up direction to form a wall washing effect. Also, alternately, the reflector can be straight or another geometric shape or non-geometric shape. The only requirement is that the reflector be angled away from the directional panel light source on the vertical surface of the wall or mount.

Figure 4:
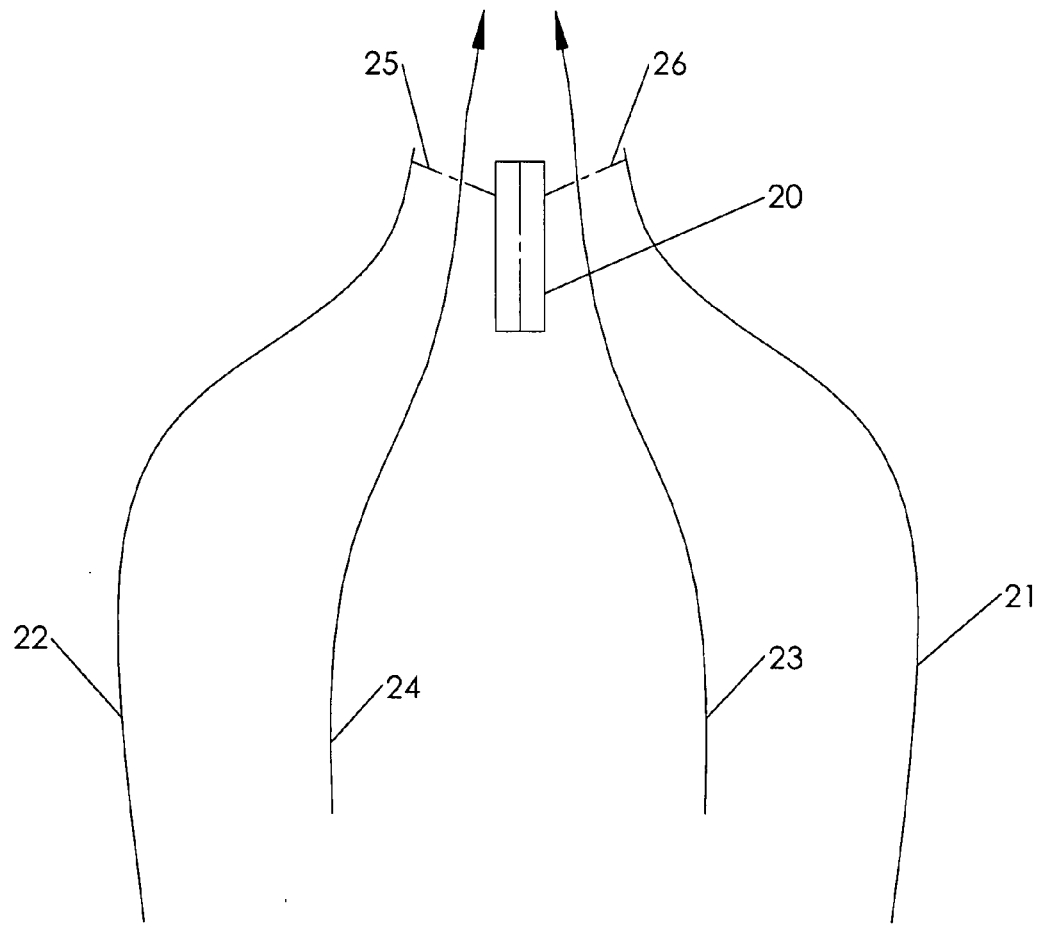
FIG. 4 is a side view of a trough light with an isotropic linear panel light source and flow through cooling of the present invention.

FIG. 4 depicts a light fixture having a substantially isotropic panel light source 20 between two reflectors 21 and 22. A first support member 25 supports and separates the first reflector 22 from the isotropic panel light source 20. A second support member 26 supports and separates the isotropic panel light source 20 from a second reflector 21. The first and second reflectors are curved reflectors, which curve down and outward from the light source. The curves of the first and second reflectors are opposite and mirror images of the other. Reflectors 21 and 22 form a trough reflector for the light emitted by substantially isotropic panel light source 20 to be reflected and directed downward.

Reflectors 21 and 22 also form a cooling means allowing airflow 24 and 23. Airflow 24 is adjacent to the curved first reflector 22 past the isotropic light source 20 and exits past the first support member 25. Airflow 23 is adjacent to the curved second reflector 21 past the isotropic light source 20 and exits past the second support member 26. The airflow 24 and 23 are via induced draft effects created by the heat generated by the directional light fixture 21 and the control of airflow by curved first reflector 22 and curved second reflector 21. As known in the art, induced draft cooling structures can be used to increase the convective cooling coefficient on a heated surface by over an order of magnitude. This approach has typically been used in electronic enclosures such as computer cabinets where a fan is not desired. The proper design of curved first reflector 22 and curved second reflector 21 can allow for enhanced cooling of isotropic light source 20 as well as be used as a reflector of the light generated by isotropic light source 20. The airflow cools the isotropic light source 20 on both sides.

Again, baffling can be optionally used to prevent light leakage through the first and second support members 25 and 26. Also alternately, the isotropic panel light source 20 can emit a portion of light past the first and second support members 25 and 26 to provide up lighting.

Figure 5:
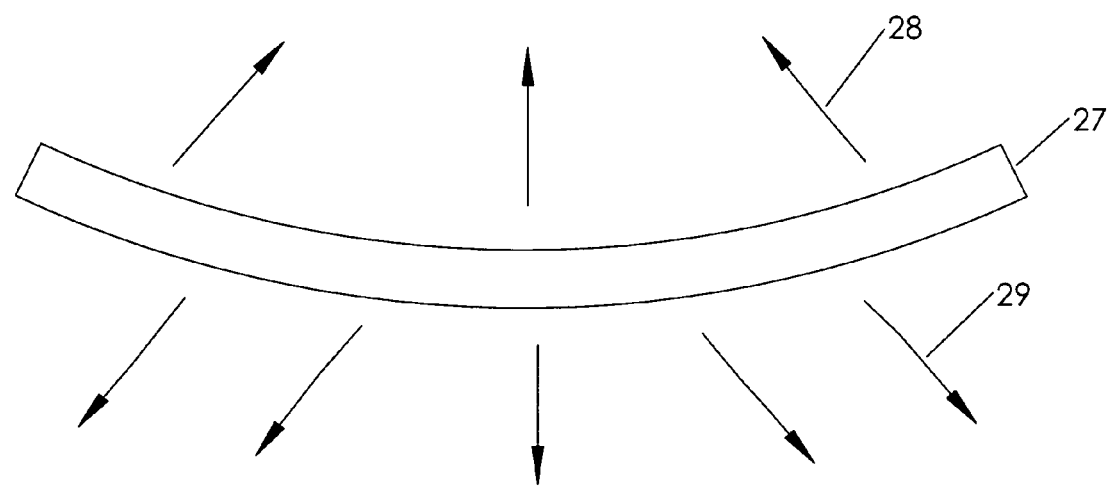
FIG. 5 is a side view of a light panel for improved reflector design of the present invention.

FIG. 5 depicts a curved panel light source 27 for a light fixture. Light 28 may be emitted on the concave curve of the panel light source 27 and/or light 29 may be emitted on the convex curve of the panel light source 27. Light 28 and 29 may be emitted from both sides of the panel light source 27. The panel light source 27 may be lambertian or isotropic. Ceramic and glass based thermally conductive luminescent elements can be easily manufactured in a non-flat shape for curved panel light source 27.

Figure 6:
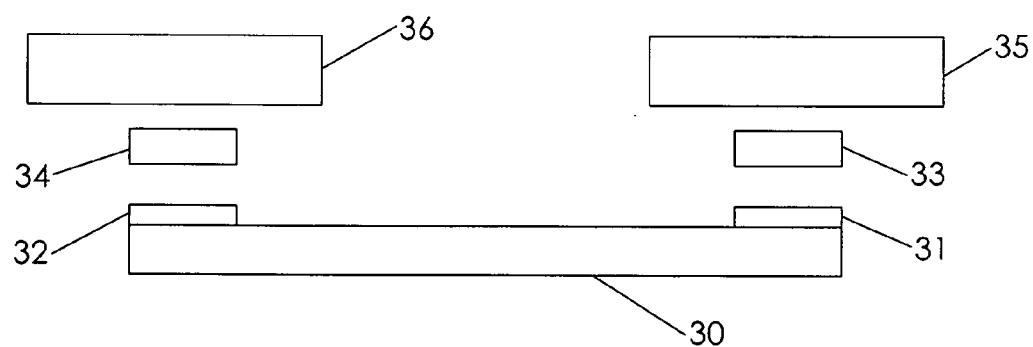
FIG. 6 is a side view of a magnetic connector for lambertian panels for ceiling lighting of the present invention.

FIG. 6 depicts the use of magnetic elements 36 and 35 to make electrical connection between fixture contacts 33 and 34 and light source contacts 31 and 32 on panel light source 30 for a light fixture. Fixture contacts 33 and 34 are stationary and fixed in position. Light source contacts 31 and 32 and attached panel light source 30 are movable. The panel light source 30 has a small mass and rigid construction. First magnetic element 36 will attract first light source contact 32 until the first light source contact 32 makes physical contact with first fixture contact 34 and stops, remaining in physical contact and electrical connection with first fixture contact 34. Second magnetic element 35 will attract second light source contact 31 until the second light source contact 31 makes physical contact with second fixture contact 33 and stops, remaining in physical contact and electrical connection with second fixture contact 33. The first and second magnetic elements 36 and 35 serve to hold the panel light source in position and hold the light source contacts 32 and 31 to the fixture contacts 34 and 31.

Figure 7:
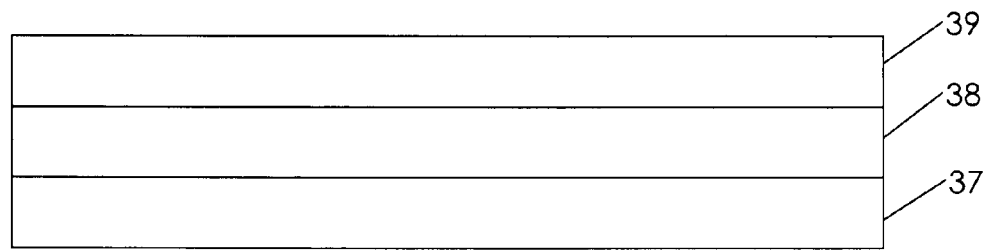
FIG. 7 is a side view of a panel light source with an energy storage means and solar cell conversion means for a light fixture of the present invention.

FIG. 7 depicts a panel light source 37 with an energy storage means 38 and solar cell conversion means 39 for a light fixture. Sunlight or external light will be incident upon the solar cell conversion means 39 which will convert the sunlight or external light into electricity. The solar cell conversion means 39 can be a standard silicon-based solar cell. The electricity will flow from the solar cell conversion means 39 to the adjacent energy storage means 38. The energy storage means 38, such as a battery or capacitor will store the electricity. The electricity will flow from the energy storage means 38 to the adjacent panel light source 37 which will emit light. The rigid nature of the thermally conductive luminescent element within the panel light source 37 provides support and cooling means for both the energy storage means 38 and solar conversion element 39. Using this configuration, a panel light source can be constructed which does not required any external power input other than incident solar energy.

Power conditioning and power converting means enable direct connection to residential and commercial DC, pulsed, or AC power sources directly on the at least one thermally conductive luminescent element. In this case, the at least one thermally conductive luminescent element becomes the substrate to which the electronic components are mounted and cooled. The electronic components may be active and passive electronic devices. Thermal and light sensors can control and protect the large area panel light source. Anti-parallel interconnects between multiple solid state light sources can be used for direct AC excitation of the panel lights.

Thermally conductive structures within the fixture provide additional cooling to the panel light via attachment to edges or at least some portion of the panel light source. A number of optical designs take advantage of the direct view capability of the at least one panel light source. The size of the panel lights are based on allowable surface brightness, required surface cooling area (which is related to the amount of available airflow and/or conduction cooling), and desired total lumens of output. More preferably, isotropic and directive panel lights have surface areas greater than 1 square inch. Even more preferably, directive and isotropic panel lights with surface brightness of between 1000 and 10000 ftl have surface areas greater than 1 sq inch.

While the invention has been described with the inclusion of specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

The invention claimed is:

1. A light fixture comprising:
   a first reflector and a second reflector, and
   an isotropic light source having a first solid wavelength conversion element on a first side of a solid state light source, and a second solid wavelength conversion element on a second side of said solid state light source, said second side being opposite said first side,
   wherein said solid state light source emits light of a first wavelength through said first solid wavelength conversion element converting a portion of said light of a first wavelength into light of a second wavelength, said second wavelength being different from said first wavelength, said light of a first wavelength and said light of a second wavelength being transmitted from said first solid wavelength conversion element to form a broader emission spectrum of light from said isotropic light source to be reflected and directed by said first reflector,
   wherein said solid state light source emits light of a first wavelength through said second solid wavelength conversion element converting a portion of said light of a first wavelength into light of a second wavelength, said second wavelength being different from said first wavelength, said light of a first wavelength and said light of a second wavelength being transmitted from said second solid wavelength conversion element to form a broader emission spectrum of light from said isotropic light source to be reflected and directed by said second reflector, and
   said first reflector and said second reflector forming a trough reflector to reflect and direct said broader emission spectrum of light from said isotropic light source.

2. The light fixture of claim 1 wherein said first reflector is separated from said isotropic light source and said second reflector is separated from said isotropic light source to provide an induced draft cooling means for said isotropic light source.

3. An isotropic light source for a light fixture comprising:
   a first curved solid wavelength conversion element on a first side of a curved solid state light source, and a second curved solid wavelength conversion element on a second side of said solid state light source, said second side being opposite said first side,
   wherein said curved solid state light source emits light of a first wavelength through said first curved solid wavelength conversion element converting a portion of said light of a first wavelength into light of a second wavelength, said second wavelength being different from said first wavelength, said light of a first wavelength and said light of a second wavelength being transmitted from said first curved solid wavelength conversion element to form a broader emission spectrum of light from said isotropic light source, and wherein said curved solid state light source emits light of a first wavelength through said second curved solid wavelength conversion element converting a portion of said light of a first wavelength into light of a second wavelength, said second wavelength being different from said first wavelength, said light of a first wavelength and said light of a second wavelength being transmitted from said second curved solid wavelength conversion element to form a broader emission spectrum of light from said isotropic light source.

* * * * *